United States Patent
Jagannathan et al.

(10) Patent No.: US 7,855,105 B1
(45) Date of Patent: Dec. 21, 2010

(54) PLANAR AND NON-PLANAR CMOS DEVICES WITH MULTIPLE TUNED THRESHOLD VOLTAGES

(75) Inventors: Hemanth Jagannathan, Albany, NY (US); Vijay Narayanan, Yorktown Heights, NY (US); Vamsi K. Paruchuri, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/487,202

(22) Filed: Jun. 18, 2009

(51) Int. Cl.
*H01L 21/332* (2006.01)
*H01L 21/8232* (2006.01)
*H01L 21/335* (2006.01)

(52) U.S. Cl. .................. 438/142; 438/135; 438/153; 438/197; 438/199; 438/206; 257/E21.629; 257/E21.632; 257/E21.703

(58) Field of Classification Search .......... 257/E21.629, 257/E21.632, E21.703
See application file for complete search history.

(56) References Cited

U.S. PATENT DOCUMENTS

| | | | |
|---|---|---|---|
| 6,303,419 B1 * | 10/2001 | Chang et al. ............... 438/202 |
| 6,633,069 B2 * | 10/2003 | Nii et al. ................... 257/370 |
| 6,642,090 B1 * | 11/2003 | Fried et al. ................ 438/164 |
| 6,660,596 B2 * | 12/2003 | Adkisson et al. ........... 438/286 |
| 6,689,653 B1 * | 2/2004 | Seah et al. ................. 438/201 |
| 6,846,734 B2 | 1/2005 | Amos et al. |
| 6,855,989 B1 | 2/2005 | Wang et al. |
| 6,909,147 B2 * | 6/2005 | Aller et al. ................. 257/347 |
| 6,936,508 B2 | 8/2005 | Visokay et al. |
| 6,936,882 B1 | 8/2005 | Ahmed et al. |
| 6,977,194 B2 * | 12/2005 | Belyansky et al. .......... 438/197 |
| 7,112,847 B1 | 9/2006 | Yu et al. |
| 7,265,417 B2 * | 9/2007 | Adkisson et al. ............ 257/347 |
| 7,288,805 B2 | 10/2007 | Anderson et al. |
| 7,361,556 B2 * | 4/2008 | Adkisson et al. ............ 438/269 |
| 7,384,830 B2 * | 6/2008 | Cohen ....................... 438/153 |
| 7,407,890 B2 * | 8/2008 | Yang ......................... 438/696 |
| 7,435,639 B2 * | 10/2008 | Winstead et al. ........... 438/199 |
| 7,439,588 B2 * | 10/2008 | Ban et al. ................... 257/351 |
| 7,491,598 B2 * | 2/2009 | Sheraw et al. .............. 438/210 |
| 7,547,947 B2 * | 6/2009 | Anderson et al. ........... 257/369 |
| 7,612,405 B2 * | 11/2009 | Yu et al. ..................... 257/328 |
| 7,674,669 B2 * | 3/2010 | Hanafi ....................... 438/206 |
| 7,718,496 B2 * | 5/2010 | Frank et al. ................. 438/275 |
| 2004/0256700 A1 | 12/2004 | Doris et al. |
| 2007/0111419 A1 | 5/2007 | Doyle et al. |
| 2007/0111448 A1 | 5/2007 | Li et al. |
| 2007/0269950 A1 | 11/2007 | Anderson et al. |

\* cited by examiner

*Primary Examiner*—Charles D Garber
*Assistant Examiner*—Mohsen Ahmadi
(74) *Attorney, Agent, or Firm*—Scully, Scott, Murphy & Presser, P.C.; Daniel P. Morris, Esq.

(57) ABSTRACT

A semiconductor structure is provided that includes a first device region including a first threshold voltage adjusting layer located atop a semiconductor substrate, a gate dielectric located atop the first threshold voltage adjusting layer, and a gate conductor located atop the gate dielectric. The structure further includes a second device region including a gate dielectric located atop the semiconductor substrate, and a gate conductor located atop the gate dielectric; and a third device region including a gate dielectric located atop the semiconductor substrate, a second threshold voltage adjusting layer located atop the gate dielectric, and a gate conductor located atop the second threshold voltage adjusting layer. In the inventive structure the first threshold voltage adjusting layer includes one of an nFET threshold voltage adjusting material or a pFET threshold voltage adjusting material and the second threshold voltage adjusting layer is the other of the nFET threshold voltage adjusting material or the pFET threshold voltage adjusting material.

14 Claims, 6 Drawing Sheets

PLANAR AND NON-PLANAR CMOS DEVICES WITH MULTIPLE TUNED THRESHOLD VOLTAGES

BACKGROUND

The present invention relates to semiconductor structures and methods of fabricating the same. More particularly, the present invention relates to planar and non-planar complementary metal oxide semiconductor (CMOS) devices having multiple tuned threshold voltages.

Advanced semiconductor chips employ multiple types of field effect transistors (FETs) having different threshold voltages, on-current per unit width and off-current per unit width. Field effect transistors having a high threshold voltage (on the order of 0.25 V or greater) are typically called "low power" devices, which have a low on-current and a low off-current. Field effect transistors (FETs) having a low threshold voltage (on the order of less than 0.25 V) are called "high performance" devices, which have a high on-current and a high off-current. By employing a mixture of low power devices, and high power devices, a semiconductor chip may provide optimal performance at an optimal power consumption level. In addition to power constraints, several threshold voltages are required to serve several functionalities on the semiconductor chip. Logic devices are typically tuned towards the band edge, while SRAM devices typically require mid-gap threshold voltages.

There are many different techniques to implement multiple threshold voltage devices including, for example, by varying the gate oxide thickness, doping densities, channel lengths and by changing the gate metals. However, these prior art techniques require separate sets of masks and processing steps to form devices of various threshold voltages. As a result, prior art processes of fabricating multiple threshold devices incur additional fabrication costs and complexity.

In addition to the above, it is possible to realize multiple threshold devices of the same physical dimensions and properties by modulating the biases applied to their bodies. However, these devices have a slower operation speed, due to time needed to charge their bodies and wells. Moreover, these prior art techniques may not be applicable to devices with fully depleted bodies.

Many of the prior art techniques for fabricating multiple threshold voltages devices such as those discussed above while applicable for planar semiconductor devices are not applicable to non-planar semiconductor devices and multiple gate devices such as, for example, FinFETs, trigate FETs or any such variety of MUGFETs (multiple gate FETs). As such, there is a need for providing a simple and cost efficient method for fabricating multiple tuned threshold voltage devices that are applicable for non-planar semiconductor devices as well as planar semiconductor devices.

BRIEF SUMMARY

The present invention provides a semiconductor structure and methodology for obtaining multiple tuned threshold voltage devices (with $T_{inv}$ scaling) on the same semiconductor wafer using an alternative technique that is applicable and ideal for non-planar semiconductor devices such as, for example, FinFET, trigate FETs or any such variety of MUGFETs devices as well as planar semiconductor devices such as for example, field effect transistors (FETs).

In one embodiment of the present invention, multiple gate stacks are provided which include a threshold voltage adjusting layer located above and/or below the gate dielectric to obtain symmetric threshold voltages.

In one aspect of the invention, a method of forming a semiconductor structure having multiple tuned threshold devices on the same semiconductor substrate is provided. The inventive method includes providing a semiconductor substrate having at least a first device region, a second device region and a third device region; forming a first threshold voltage adjusting layer within the first device region, said first threshold voltage adjusting layer being absent from the second and third device regions and including one of an nFET threshold voltage adjusting material or a pFET threshold voltage adjusting material; forming a gate dielectric within the first device region, the second device region and the third device region; forming a second threshold voltage adjusting layer within either the second or third device regions, yet absence from the first device region, said second threshold voltage adjusting layer is the other of the nFET threshold voltage adjusting material or the pFET threshold voltage adjusting material; and forming a gate conductor within the first, second and third device regions.

In another aspect of the invention, a semiconductor structure is provided that includes a first device region having a first threshold voltage adjusting layer located atop on a semiconductor substrate, a gate dielectric located atop the first threshold voltage adjusting layer, and a gate conductor located atop the gate dielectric; a second device region including a gate dielectric located atop the semiconductor substrate, and a gate conductor located atop the gate dielectric; and a third device region including a gate dielectric located atop the semiconductor substrate, a second threshold voltage adjusting layer located atop the gate dielectric, and a gate conductor located atop the second threshold voltage adjusting layer, wherein said first threshold voltage adjusting layer includes one of an nFET threshold voltage adjusting material or a pFET threshold voltage adjusting material and said second threshold voltage adjusting layer is the other of said nFET threshold voltage adjusting material or the pFET threshold voltage adjusting material.

DETAILED DESCRIPTION

The present invention, which provides a semiconductor structure and methodology for obtaining multiple tuned threshold voltage devices (with $T_{inv}$ scaling) on the same semiconductor wafer using an alternative technique that is applicable and ideal for non-planar semiconductor devices as well as planar semiconductor devices, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Reference is now made to FIGS. 1-9A which illustrate the basic processing steps that can be utilized in one embodiment of the present invention to form a semiconductor structure having at least three devices of different threshold voltages in different device regions. In the embodiment illustrated and described herein below, the semiconductor devices that are being fabricated are FinFET devices. Although such non-planar semiconductor devices are being described and illustrated, the inventive methodology can be applied to other types of non-planar semiconductor devices as well as planar semiconductor devices such as planar FET devices. When planar devices are to be fabricated, the processing steps shown in FIG. 2 may be omitted and the interfacial layer, if present, or the first threshold voltage adjusting layer is formed on a planar surface of a semiconductor substrate.

Figure 1:
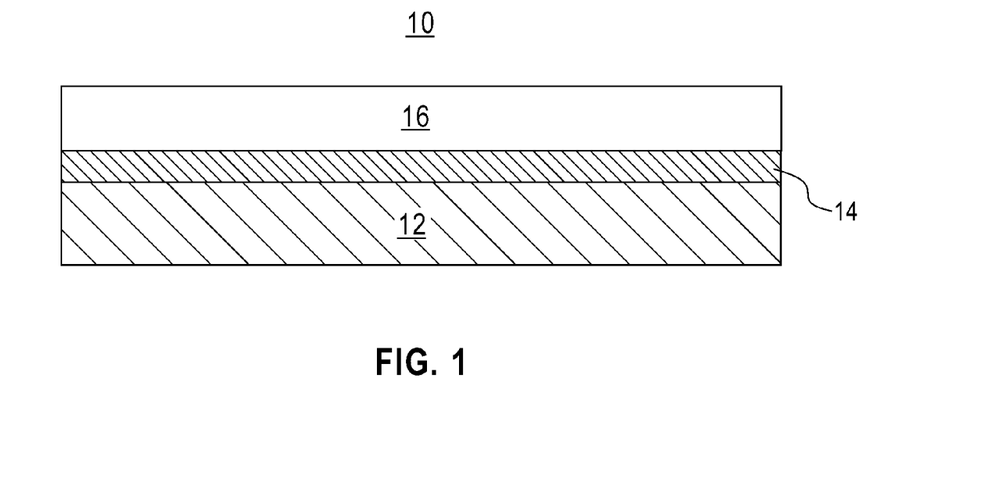
FIG. 1 is a pictorial representation (through a cross sectional view) illustrating a semiconductor substrate that can be used in the present invention.

Specifically, FIG. 1 is a pictorial representation of a semiconductor substrate 10 that can be employed in the present invention. The semiconductor substrate 10 shown in FIG. 1 is a semiconductor-on-insulator substrate including a bottom semiconductor layer 12 and a top semiconductor layer, e.g., SOI layer, 16 that are separated, at least in part, by a buried insulating layer 14. Although illustration is made to a semiconductor-on-insulator substrate, semiconductor substrate 10 can also be a bulk semiconductor substrate including one or more semiconducting materials, or a hybrid semiconductor substrate including at least two surface regions that have different crystallographic orientations. The hybrid substrate can have regions that are all SOI like (i.e., have a buried insulating layer beneath an SOI layer) or some regions can be SOI like and others are bulk like.

The semiconductor substrate 10 can be fabricated using processing techniques well known to those skilled in the art. For example, semiconductor-on-insulator substrates can be formed by wafer bonding, lamination, or by a process in which insulating ions are first implanted into a bulk semiconductor material and thereafter an annealing step is performed that converts the implant region into a buried insulating region. When a hybrid substrate is employed, wafer bonding, etching and epitaxial growth such as described, for example, within U.S. Patent Application No. 2004/0256700 A1 can be employed.

As mentioned above, the semiconductor substrate 10 illustrated in FIG. 1 includes a top semiconductor layer 16 and a bottom semiconductor layer 12 that are separated, at least in part, by a buried insulating layer 14.

The top and bottom semiconductor layers can be comprised of the same or different semiconductor material. The term "semiconductor material" when used in describing the semiconductor substrate 10 comprises any material that has semiconductor properties including, but not limited to Si, Ge, SiGe, SiC, SiGeC, GaAs, GaN, InAs, InP and all other III/V or II/V compound semiconductor. In some embodiments of the present invention, it is preferred that the semiconductor material of the semiconductor substrate 10 is a Si-containing semiconductor material, i.e., a semiconductor material that includes silicon. In highly preferred embodiments of the invention, the semiconductor substrate 10 is comprised of silicon.

The semiconductor substrate 10 may be doped, undoped or contain doped and undoped regions therein. For clarity, the doped regions are not specifically shown in the drawings of the present application. Each doped region within the semiconductor substrate 10 may have the same, or they may have different conductivities and/or doping concentrations. The doped regions that are present in the semiconductor substrate 10 are typically referred to as well regions and they are formed utilizing a conventional ion implantation process.

The buried insulating layer 14 may comprise a crystalline or non-crystalline oxide, nitride or oxynitride nitride. In some embodiments of the present invention, the buried insulating layer 14 is preferably an oxide.

The thickness of the various layers of the semiconductor-on-insulator substrate illustrated in FIG. 1 may vary. Typically, the top semiconductor layer 16 of the semiconductor-on-insulator substrate has a thickness from 10 nm to 300 nm, with a thickness from 25 nm to 50 nm being even more typical. The thickness of the buried insulating layer 14 of the semiconductor-on-insulator substrate is typically from 40 nm to 250 nm, with a thickness from 125 nm to 175 nm being even more typical. The thickness of the bottom semiconductor layer 12, which may vary, is inconsequential to the invention described herein. A thinner bottom semiconductor layer may be used for 3D integration schemes and for processes where the bottom semiconductor layer is sacrificial.

At this point of the inventive process, isolation regions (not shown) are optionally formed into the semiconductor substrate 10; the isolation regions are typically used when planar FETs are to be formed. The isolation regions may be trench isolation regions or field oxide isolation regions. Trench isolation regions are formed utilizing a conventional trench isolation process well known to those skilled in the art. For example, a trench isolation region can be formed by lithography, etching, and filling a trench with a trench dielectric. Optionally, a liner may be formed in the trench prior to trench fill, a densification process may be performed after the trench fill and a planarization process may follow the trench fill. Field oxide regions may be formed utilizing a so-called local oxidation of silicon process. Note that the isolation regions provide isolation between neighboring semiconductor devices, typically required when the neighboring semiconductor devices have different conductivities.

Next, a blanket layer of hard mask material (not shown) is formed atop the uppermost surface of the semiconductor substrate 10 shown in FIG. 1. The hard mask material may comprise an oxide, a nitride, an oxynitride or combinations and multilayers thereof. Illustrative examples of hard mask materials include, but are not limited to silicon dioxide and/or silicon nitride. The hard mask may be formed utilizing a conventional deposition process including, but not limited to chemical vapor deposition (CVD), plasma enhanced chemical vapor deposition (PECVD), atomic layer deposition (ALD) and chemical solution deposition. Alternatively, the hard mask may be formed by a thermal process such as, for example thermal oxidation, thermal nitridation and thermal oxynitridation. In some embodiments, the hard mask can be formed by a combination of any of the above mentioned techniques.

The thickness of the hard mask that is formed at this point of the present invention may vary depending on the type of hard mask material used as well as the technique that was used for forming the same. Typically, the hard mask has a thickness from 10 nm to 60 nm, with a thickness from 20 to 40 nm being more typical.

Figure 2:
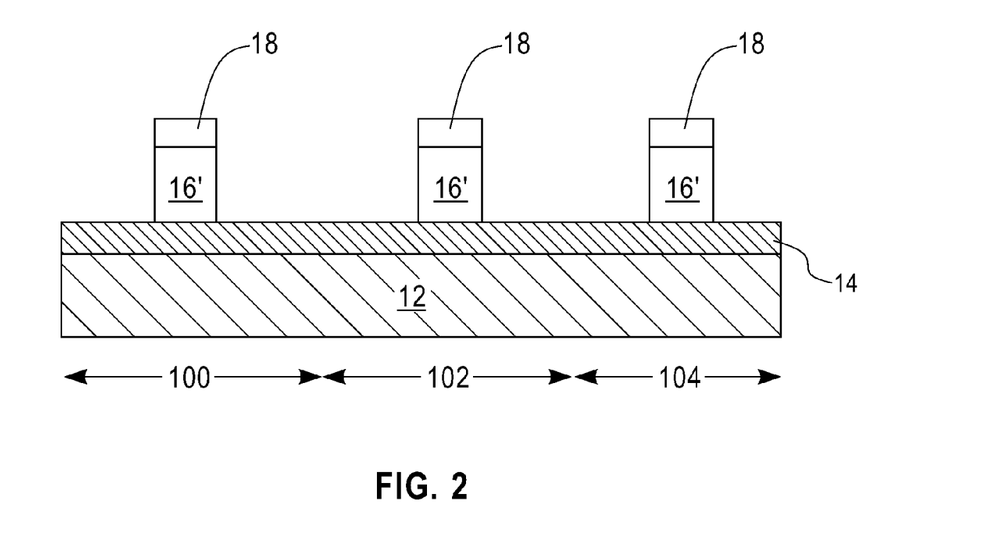
FIG. 2 is a pictorial representation (through a cross sectional view) illustrating a structure that is formed after forming a plurality of device regions within the semiconductor substrate shown in FIG. 1, each plurality of device regions including at least one semiconductor fin.

Next, and as shown in FIG. 2, the structure shown in FIG. 1 including the blanket layer of hard mask atop the top semiconductor layer 16 of the semiconductor substrate 10 is patterned utilizing lithography and etching to provide a structure including at least three device regions 100, 102, and 104, respectively. Each of the device regions 100, 102 and 104 includes a patterned top semiconductor layer 16' and a patterned hard mask 18. The patterned semiconductor layer 16' is referred to as the fin of the FinFET structure being formed. It is observed that although three device regions are specifically shown in the drawings, the present invention also contemplates cases in which more than three device regions are formed by lithography and etching. Alternatively techniques such as, for example, a sidewall spacer as a hard mask, and self-assembly may also be employed in the present invention to form the fins of the patterned device regions.

The lithography step used in forming the various device regions includes applying a photoresist atop the hard mask, exposing the photoresist to a desired pattern of radiation and developing the exposed photoresist utilizing a conventional resist developer. After resist development, one or more etching processes are employed in transferring the pattern from the patterned photoresist to the hard mask and then to the underlying top semiconductor layer 16 of the semiconductor substrate 10. The one or more etching steps may include dry etching, wet chemical etching or a combination thereof. Examples of suitable dry etching techniques include reactive ion etching, plasma etching, ion beam etching or laser ablation. In some embodiments, the pattern photoresist is removed from the surface of the structure after transferring the pattern into the hard mask. In other embodiments, the patterned photoresist remains on the structure during the transfer of the pattern to the top semiconductor layer 16. In either instance, the patterned photoresist is removed utilizing a conventional resist removal process such as, for example, ashing. It is noted that the depth of this etch may vary and is not limited to the embodiment shown in which the etch stops on a surface of the buried insulating layer 14. In some embodiments, for example, the etch may be stopped above the buried insulating layer 14, while in other embodiments the etch may be stopped below the buried insulating layer 14. In yet other embodiments, the etch may be stopped at various depths within the semiconductor substrate 10.

As mentioned above, alternative techniques including a sidewall spacer as a hard mask, and self-assembly may also be employed in the present invention to form the fins of the patterned device regions. Those techniques can be used to provide sub-lithographic features (e.g., 50 nm or less). The sidewall spacer technique includes forming a sacrificial material on the top semiconductor layer, depositing oxide or nitride spacers, and removing the sacrificial material leaving behind the spacers. The spacers are then used as a hard mask during the etching of the top semiconductor layer. When self-assembly is employed, a conventional self-assembly block copolymer can be used to provide patterns that are sub-lithographic.

Each patterned semiconductor layer 16' (herein after referred to as semiconductor fin 16') has a vertical height from 10 to 300 nm, with a vertical height from 25 to 50 nm being more typical. The width of each semiconductor fin 16' formed is from 2 to 50 nm, with a width from 5 to 20 nm being more typical.

After forming the structure shown in FIG. 2, the patterned hard mask 18 can optionally be removed from each of the semiconductor fins 16' utilizing a conventional wet or dry etching process. In embodiments in which the patterned hard mask 18 is removed, the upper surface of each of the semiconductor fins 16' in the various device regions is exposed. In this case, the exposed surface would behave as an additional gate in the device.

An optional interfacial layer (not shown) is then formed on all the exposed semiconductor surfaces, e.g., on sidewalls and optionally a top surface, of each of the semiconductor fins 16'. The optional interfacial layer is formed utilizing a conventional thermal growing technique that is well known to those skilled in the art including, for example, oxidation or oxynitridation. When the exposed semiconductor material, e.g., fin, is a Si-containing material, the interfacial layer is comprised of silicon oxide, silicon oxynitride, or a nitrided silicon oxide. When the exposed semiconductor material is other than a Si-containing semiconductor material, the interfacial layer may comprise a semiconductor oxide, a semiconducting oxynitride or a nitrided semiconducting oxide.

The thickness of the interfacial layer is typically from 0.1 nm to 1.5 nm, with a thickness from 0.5 to 1.2 nm being even more typical. The thickness, however, may be different after processing at higher temperatures, which are usually required during finFET and CMOS fabrication.

In accordance with an embodiment of the invention, the interfacial layer is a silicon oxide layer having a thickness from 0.5 nm to 0.8 nm that is formed by a wet chemical oxidation. The process step for this wet chemical oxidation includes treating a cleaned surface of a semiconductor material (such as a HF-last semiconductor surface) with a mixture of ammonium hydroxide, hydrogen peroxide and water (in a 1:1:5 ratio) at 65° C. Alternatively, the interfacial layer can also be formed by treating the HF-last semiconductor surface in ozonated aqueous solutions, with the ozone concentration usually varying from, but not limited to 2 parts per million (ppm) to 40 ppm.

Figure 3:
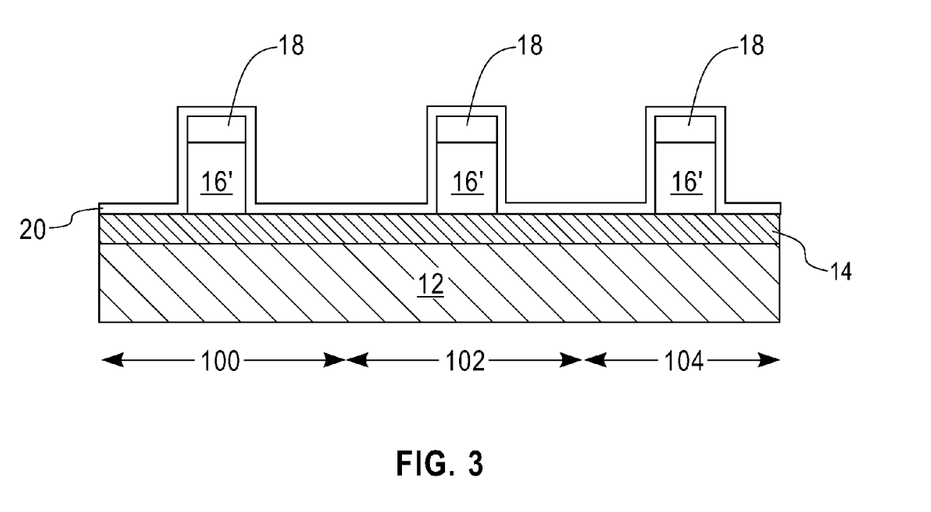
FIG. 3 is a pictorial representation (through a cross sectional view) illustrating the structure that is formed after forming a first threshold voltage adjusting layer on exposed surfaces of the structure shown in FIG. 2.

Next, and as illustrated in FIG. 3, a first threshold voltage adjusting layer 20 is formed over the entire surface of the structure (with or without the interfacial layer) shown in FIG. 2. The term "threshold voltage adjusting layer" as used throughout the instant application denotes a material that moves the threshold voltage towards either the nFET or pFET band edge.

The first threshold voltage layer 20 employed in the present invention may include an nFET threshold voltage adjusting material or a pFET threshold voltage adjusting material. The type of threshold voltage adjusting material employed in this step of the invention is dependent on which conductivity type device, e.g., nFinFET or pFinFET, is being fabricated in the first device region 100.

One example of an nFET threshold voltage adjusting material that can be used in the present invention is a rare earth metal-containing material that typically comprises an oxide or nitride of at least one element from Group IIIB of the Periodic Table of Elements (CAS version) including, for example, La, Ce, Pr, Nd, Pm, Sm, Eu, Ga, Tb, Dy, Ho, Er, Tm, Yb, Lu or mixtures thereof. In some embodiments, a rare earth metal (e.g., a metal from Group IIIB of the Periodic Table of Elements) can be used. Preferably, the rare earth metal-containing material comprises an oxide or La, Ce, Y, Sm, Er and/or Tb, with $La_2O_3$ or LaN being more preferred.

The rare earth metal or rare earth metal-containing material is formed utilizing a conventional deposition process including, for example, evaporation, molecular beam deposition, metalorgano chemical vapor deposition (MOCVD), atomic layer deposition (ALD), physical vapor deposition (PVD) and other like deposition processes. In some embodiments of the invention, ALD is highly preferred in forming the rare earth metal or the rare earth metal-containing material.

In one embodiment of the present invention, the rare earth metal-containing material is formed by placing the structure shown in FIG. 2 into the load-lock of a molecular beam deposition chamber, followed by pumping this chamber down to the range of $10^{-5}$ to $10^{-8}$ Torr. After these steps, the structure is inserted, without breaking vacuum into the growth chamber where the rare earth metal-containing material such as La oxide is deposited by directing atomic/molecular beams of the rare earth metal and oxygen or nitrogen onto the structure's surface. Specifically, because of the low pressure of the chamber, the released atomic/molecular species are beamlike and are not scattered prior to arriving at the structure. A substrate temperature of about 300° C. is used. In the case of $La_2O_3$ deposition, the La evaporation cell is held in the temperature range of 1400° to 1700° C., and a flow rate of 1 to 3 seem of molecular oxygen is used. Alternatively, atomic or excited oxygen may be used as well, and this can be created by passing the oxygen through a radio frequency source excited in the range of 50 to 600 Watts. During the deposition, the pressure within the chamber can be in the range from $1\times10^{-5}$ to $8\times10^{-5}$ Torr, and the La oxide growth rate can be in the range from 0.1 to 2 nm per minute, with a range from 0.5 to 1.5 nm being more typical.

Another example of an nFET threshold voltage adjusting material that can be used in the present invention is an alkaline earth metal-containing material that comprises a compound having the formula $MA_x$ wherein M is an alkaline earth metal (Be, Mg, Ca, Sr, and/or Ba), A is one of O, S and a halide, and x is 0, 1 or 2. It is noted that the present invention contemplates alkaline earth metal-containing compounds that include a mixture of alkaline earth metals and/or a mixture of anions, such as an oxychloride. Examples of alkaline earth metal-containing compounds that can be used in the present invention include, but are not limited to MgO, MgS, $MgF_2$, $MgCl_2$, $MgBr_2$, $MgI_2$, CaO, CaS, $CaF_2$, $CaCl_2$, $CaBr_2$, $CaI_2$, SrO, SrS, $SrF_2$, $SrCl_2$, $SrBr_2$, $SrI_2$, BaO, BaS, $BaF_2$, $BaCl_2$, $BaBr_2$, and $BaI_2$. In one preferred embodiment of the present invention, the alkaline earth metal-containing compound includes Mg. MgO is a highly preferred alkaline earth metal-containing material employed in the present invention.

The alkaline earth metal-containing material is Banned utilizing a conventional deposition process including, for example, sputtering from a target, reactive sputtering of an alkaline earth metal under oxygen plasma conditions, electroplating, evaporation, molecular beam deposition, MOCVD, ALD, PVD and other like deposition processes.

In addition to nFET threshold voltage adjusting materials, the first threshold voltage adjusting layer 20 can alternatively be a pFET threshold voltage adjusting material. Examples of pFET threshold voltage adjusting materials include Al (and its compounds that are non-conductive such as, for example $Al_2O_3$), Ge (and its compounds that are non-conductive such as, for example $GeO_2$), and non-conductive compounds of Ti and Ta such as, $TiO_2$ and $Ta_2O_5$, respectively.

The pFET threshold voltage adjusting materials are formed utilizing conventional deposition processes well known to those skilled in the art including, but not limited to chemical vapor deposition (CVD), plasma enhanced chemical vapor deposition (PECVD), chemical solution deposition, atomic layer deposition (ALD), physical vapor deposition, sputtering and plating.

Notwithstanding the type of material used as the first threshold voltage adjusting layer 20, the first threshold voltage adjusting layer 20 has a thickness from 0.1 to 5.0 nm, with a thickness from 0.3 to 2.0 nm being even more typical.

Figure 4:
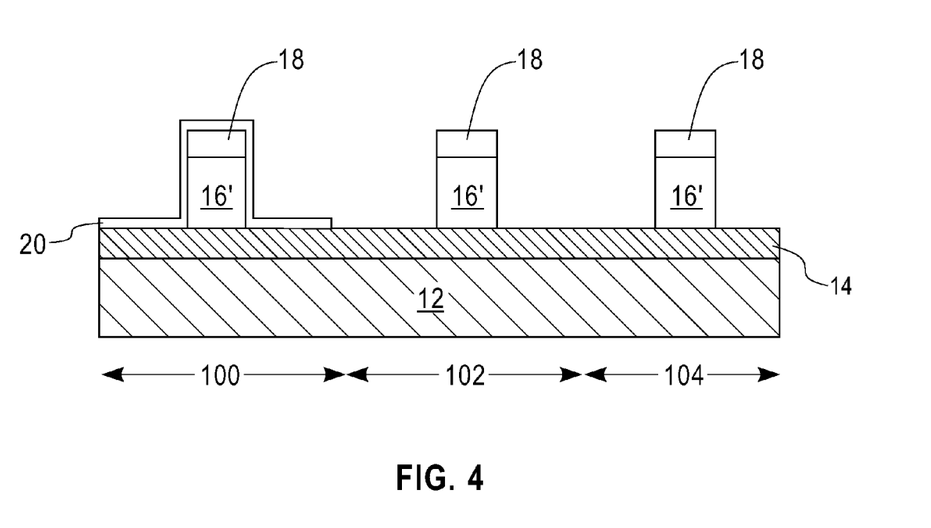
FIG. 4 is a pictorial representation (through a cross sectional view) illustrating the structure of FIG. 3 after patterning the first threshold voltage adjusting layer to remain within at least one of the device regions.

Next, and as illustrated in FIG. 4, the first threshold voltage adjusting layer 20 is patterned to be located only within one of the device regions. In the embodiment illustrated in the drawings, the first threshold voltage adjusting layer 20 is patterned to be only present within the first device region 100. This patterning step of the present invention is achieved by forming a block mask over the first device region 100 and then selectively removing via etching the first threshold voltage adjusting layer 20 from the second device region 102 and the third device region 104. The selective removal of the first threshold adjusting layer 20 from unwanted device regions includes a wet chemical etching process which removes the first threshold voltage adjusting layer 20 selective to the underlying layers including, for example, the buried insulating layer 14, the semiconductor fin 16' and the patterned hard mask 18. An example of a wet chemical etchant that can be used to selectively remove the first voltage threshold adjusting layer 20 from the second device region 102 and the third device region 14 is HCl, ammonium hydroxide, HF and a mixture of ammonium hydroxide, hydrogen peroxide and water. After the selective removal step, the block mask is removed from the structure utilizing a conventional stripping process well known to those skilled in the art.

In some embodiments of the present invention, an optional threshold voltage adjusting layer (not shown) can be formed on the structure shown in FIG. 4 and then patterned such that the optional threshold voltage adjusting layer is present in device regions not including the first threshold voltage adjusting material. The optional threshold voltage adjusting layer includes either an nFET threshold voltage adjusting material or pFET threshold voltage adjusting material which is opposite to the type of material used for the first threshold voltage adjusting layer 20. That is, when the first voltage threshold adjusting layer 20 is an nFET threshold voltage adjusting material, the threshold voltage adjusting layer is a pFET threshold voltage adjusting material.

The optional threshold voltage adjusting layer is fanned utilizing the techniques mentioned above for the first threshold voltage adjusting layer 20, patterned as described above, and the thickness of the optional threshold voltage adjusting layer is within the thickness regime mentioned for the first threshold voltage adjusting layer 20 as well.

In other embodiments of the invention, and when the first or optional threshold voltage material is an nFET threshold voltage material, the inventive method can be modified such that the nFET threshold voltage adjusting material remains within a pFET device region.

Figure 5:
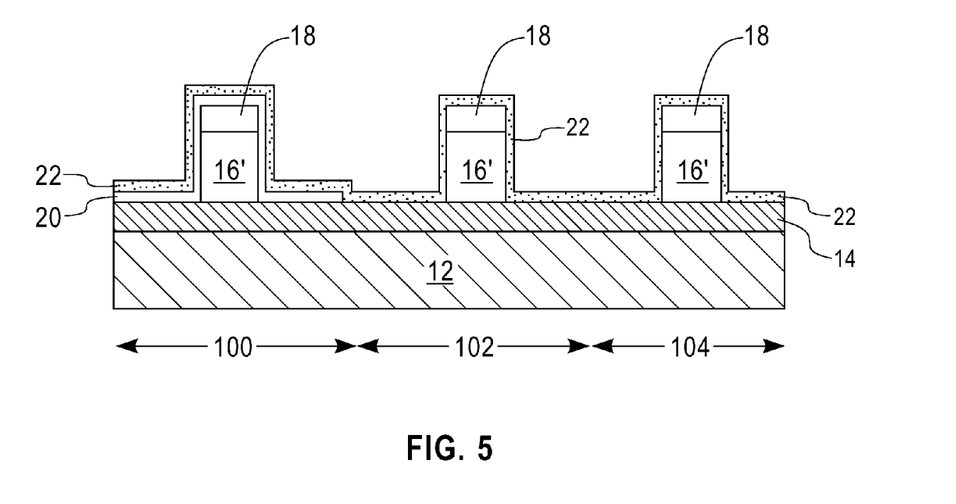
FIG. 5 is a pictorial representation (through a cross sectional view) illustrating the structure of FIG. 4 after forming a gate dielectric on all exposed surfaces in each of the device regions.

Next, a gate dielectric 22 is formed within each of the device regions 100, 102, and 104, respectively shown in FIG. 4 to provide the structure shown in FIG. 5. It is observed that the first threshold voltage adjusting layer 20 and, if present, the optional threshold voltage adjusting layer, are located beneath the gate dielectric 22.

The gate dielectric 22 may comprise an oxide, a nitride and/or an oxynitride. In one embodiment of the invention, a dielectric material having a dielectric constant, as measured in vacuum, of about 4.0 or less, such as, for example silicon dioxide is employed as the gate dielectric 22. In another embodiment of the invention, a dielectric material having a dielectric constant of greater than 4.0, typically greater than 10, as measured in vacuum, is used as gate dielectric 22.

Examples of such dielectric materials having a dielectric constant of greater than 4.0 include, but are not limited to silicon nitride, silicon oxynitride, metal oxides, metal nitrides, metal oxynitrides and/or metal silicates. In one embodiment, the gate dielectric 22 is comprised of $HfO_2$, $ZrO_2$, $Al_2O_3$, $TiO_2$, $La_2O_3SrTiO_3$, $LaAlO_3$ $Y_2O_3$ and multilayered stacks thereof. In another embodiment of the invention, the gate dielectric 22 is a Hf-based gate dielectric including $HfO_2$, hafnium silicate and hafnium silicon oxynitirde.

The gate dielectric 22 can be formed utilizing a thermal growth process such as, for example, oxidation, nitridation or oxynitridation. Alternatively, the gate dielectric 22 can be formed by a deposition process including, but not limited to CVD, PECVD, MOCVD, ALD, evaporation, reactive sputtering and chemical solution deposition. The gate dielectric 22 may also be formed utilizing any combination of the aforementioned processes.

The thickness of the as deposited gate dielectric 22 may vary depending on the dielectric material employed as well as the process used to form the same. Typically, the thickness of the as deposited gate dielectric 22 is from 0.5 nm to 20 nm, with a thickness from 1 nm to 10 nm being even more typical.

Figure 6:
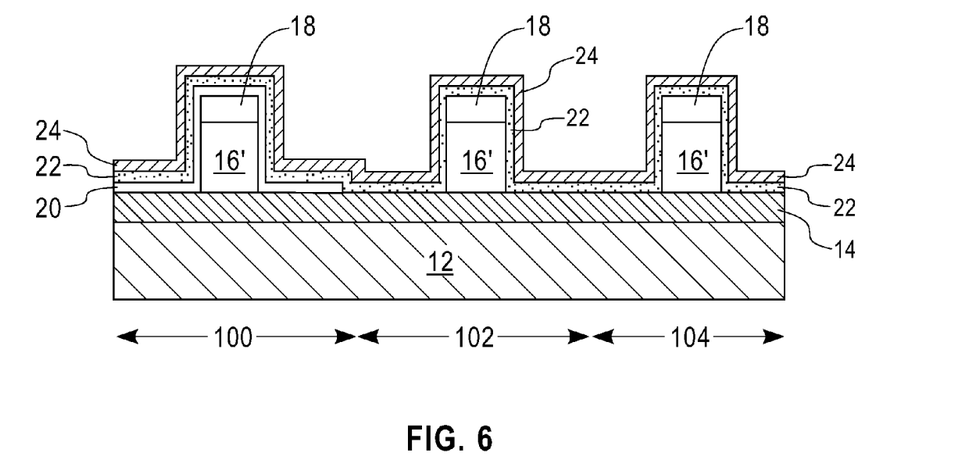
FIG. 6 is a pictorial representation (through a cross sectional view) illustrating the structure of FIG. 5 after forming a second threshold voltage adjusting layer on said gate dielectric in each of the device regions.
Figure 7:
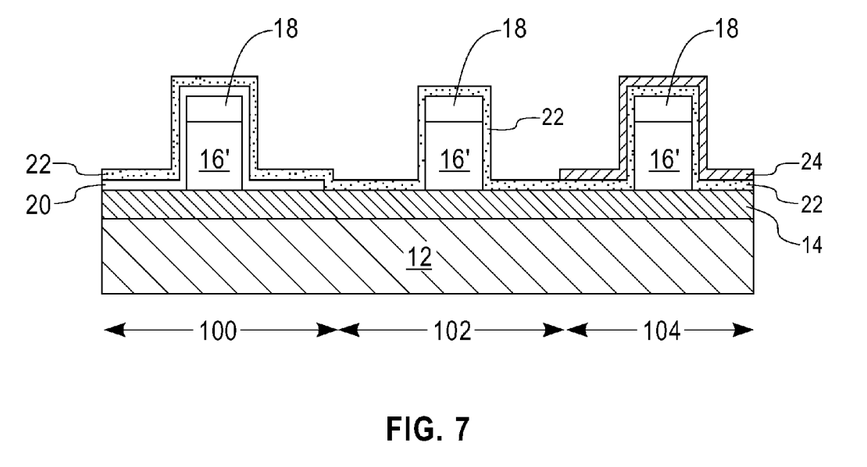
FIG. 7 is a pictorial representation (through a cross sectional view) illustrating the structure of FIG. 6 after patterning the second threshold voltage adjusting layer to remain within at least one of the device regions not including the first threshold voltage adjusting layer.

Next, and as shown in FIG. 6, a second voltage adjusting layer 24 is formed on the gate dielectric 22. The second voltage adjusting layer 24 is then patterned, as shown in FIG. 7, such that it is present in one of the device regions not including the first threshold voltage adjusting layer. In the illustrated embodiment, the second voltage adjusting layer 24 is patterned to be present within the third device region 104. In such an embodiment, the optional threshold voltage layer may be present within the second device region 102. The second threshold voltage adjusting layer 24 includes either an nFET threshold voltage adjusting material or pFET threshold voltage adjusting material which is opposite to the type of material used for the first threshold voltage adjusting layer 20. That is, when the first voltage threshold adjusting layer 20 is an nFET threshold voltage adjusting material, the second threshold voltage adjusting layer 24 is a pFET threshold voltage adjusting material.

The second threshold voltage adjusting layer 24 is formed utilizing the techniques mentioned above for the first threshold voltage adjusting layer 20, and the thickness of the second threshold voltage adjusting layer 24 is within the thickness regime mentioned for the first threshold voltage adjusting layer 20 as well.

Figure 8:
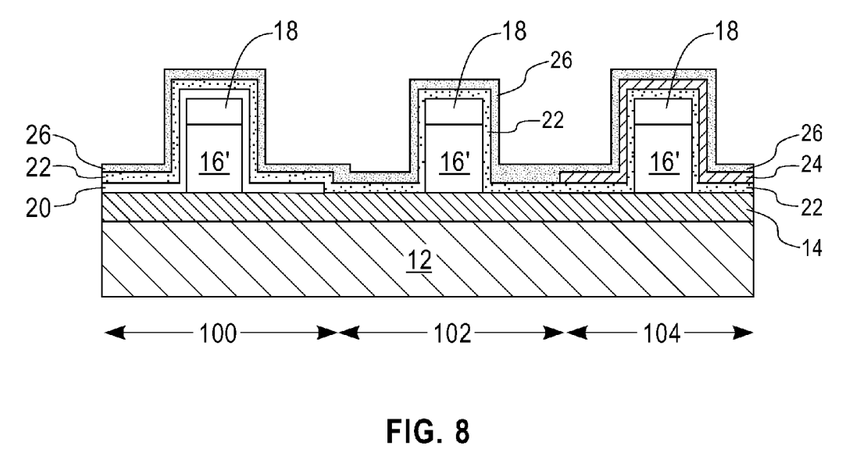
FIG. 8 is a pictorial representation (through a cross sectional view) illustrating the structure of FIG. 7 after forming a gate conductor on all exposed surfaces in each of the device regions.

Next, and as shown in FIG. 8, a gate conductor 26 is formed on the structure shown in FIG. 7, e.g., atop the gate dielectric 22 in the first device region 100 and the second device region 102, and atop the second voltage adjusting layer 24 in the third device region 104. The gate conductor 26 is comprised of any conductive material including, but not limited to polysilicon, SiGe, an elemental metal, an alloy including an elemental metal, a metal silicide, a metal nitride or any combination thereof including multilayers. Examples of elemental metals that can be used as the gate conductor 26 include metals from Group VIIB, VIIB and VIII of the Periodic Table of Elements (CAS version). The thickness of the gate conductor 26 may vary, with typical thicknesses being from 20 nm to 200 nm. More typically, the thickness of the gate conductor 26 is from 50 nm to 150 nm.

The gate conductor 26 is formed utilizing conventional techniques well known to those skilled in the art. When a silicide is formed, a conventional silicidation process can be used to form the same. The silicidation process can provide a fully silicided gate or a partially silicided gat including a top silicide layer and a bottom metal layer.

Figure 9A:
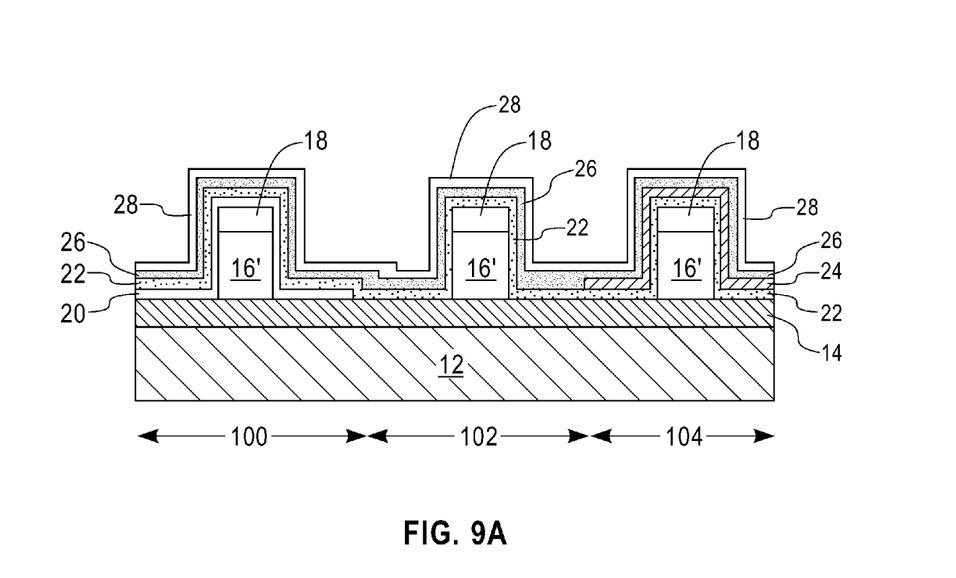
FIG. 9A is a pictorial representation (through a cross sectional view) after forming a Si-containing material on the structure shown in FIG. 8 in accordance with one embodiment of the invention.

Next, and as shown in FIG. 9A, a Si-containing material 28 such as polysilicon, single crystal single, amorphous silicon, and SiGe, is conformally formed on the exposed upper surface of the gate conductor 26. The Si-containing material 28 can be formed utilizing a conventional deposition process including, but not limited to epitaxial growth, CVD, PECVD, and ALD. The thickness of the Si-containing material 28 may vary depending on the technique used to form the same.

At this point of the present invention conventional processes can be performed to complete the devices in each of the device regions. For example, source/drain regions can be formed via ion implantation and annealing, raised source/drain regions can be formed, silicide contacts can be formed at least atop the source/drain regions, a middle-of-the line (MOL) interconnect structure can be formed including a MOL dielectric containing a via filled with a contact metal, and a back-end-of-the-line (BEOL) structure can be formed including a BEOL dielectric having conductively filled lines and/or vias located therein. The details concerning these processes that are performed after providing the structure shown in FIG. 9 are not provided so as to not obscure the present invention.

It is noted that a replacement gate process can be used instead of the processing mentioned above in forming the gate structure.

Figure 9B:
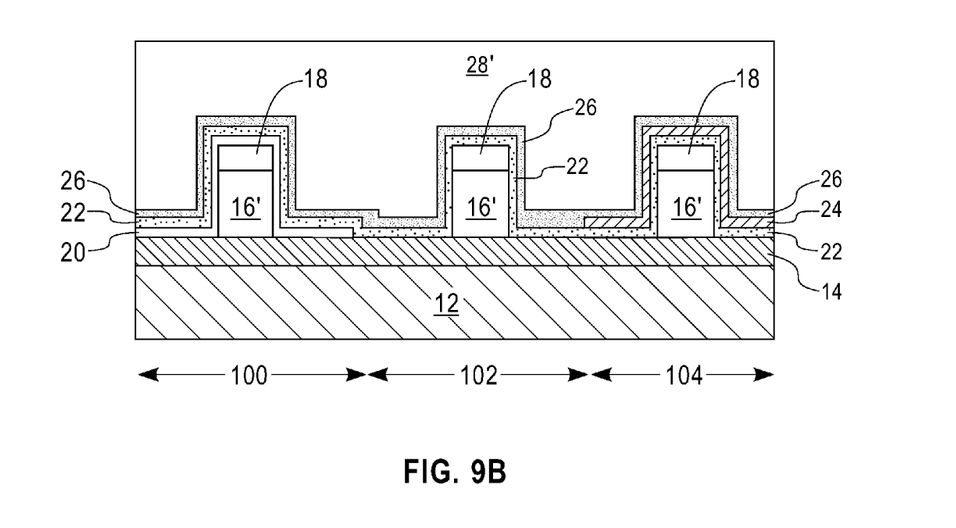
FIG. 9B is a pictorial representation (through a cross sectional view) after forming a Si-containing material on the structure shown in FIG. 8 in accordance with another embodiment of the invention.

In another embodiment of the present invention, the structure shown in FIG. 8 is first formed and thereafter a blanket layer of a Si-containing material 28' is deposited and then subjected to a planarization process, such as chemical mechanical polishing and/or grinding, providing the structure shown in FIG. 9B. The Si-containing material 28' shown in FIG. 9B includes one of the Si-containing materials 28 described above in regard to FIG. 9A.

Figure 10:
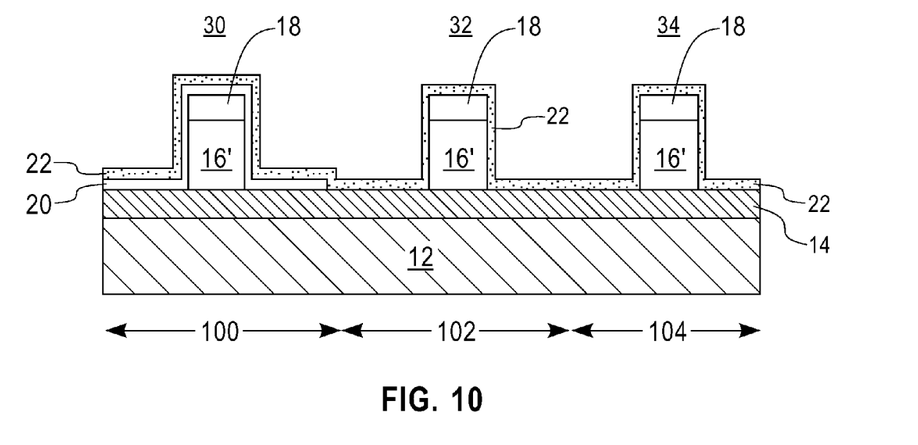
FIG. 10 is a pictorial representation (through a cross sectional view) after annealing and removing the Si-containing material, the gate conductor, and the various threshold voltage adjusting layers that are present atop the gate dielectric from the structure shown in either FIG. 9A or FIG. 9B.

In some embodiments of the present invention, an annealing step and removal of the Si-containing material, the gate conductor and the residual threshold voltage adjusting layers that are located atop the gate dielectric is then performed on the structure shown in either FIG. 9A or 9B providing the structure shown in FIG. 10. In FIG. 10, threshold voltage adjustment of the devices is achieved by diffusing the threshold voltage adjusting species from the threshold voltage adjusting layers into the remaining gate stack. In FIG. 10, the threshold voltage adjusted gate stacks are labeled as 30, 32 and 34. The diffused threshold voltage adjusting species may reside in the gate dielectric, remaining as a threshold voltage adjusting layer that is present beneath the gate dielectric, the interfacial layer, a top portion of the substrate or any combination thereof.

When the structure shown in FIG. 10 is formed, annealing is typically performed at a temperature from 900° C. to 1300° C., with a temperature from 1000° C. to about 1100° C. being even more typical. The annealing may include a thermal anneal, a rapid thermal anneal or a laser anneal. The annealing that causes the diffusion of the threshold voltage adjusting species from the various threshold voltage adjusting layers is performed in an inert ambient including for example, helium, neon, argon or any mixtures thereof. After annealing, and as stated above, the Si-containing material, the gate conductor, and the various threshold voltage adjusting layers are removed stopping on the gate dielectric 22 utilizing one or more etching steps that selectively remove those layers from the gate stack.

Figure 11:
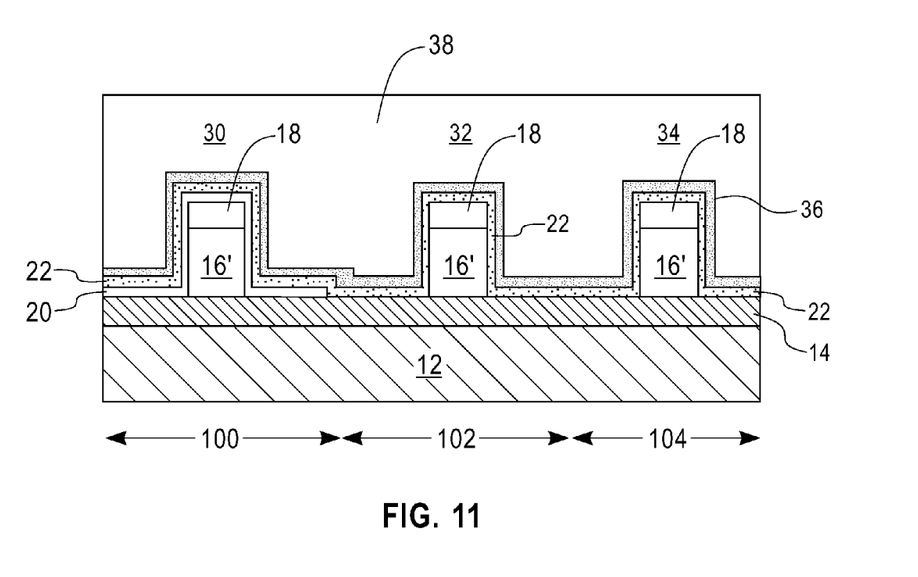
FIG. 11 is a pictorial representation (through a cross sectional view) after forming a single metal electrode and formation of a second Si-containing layer on the structure shown in FIG. 10.

After providing the structure shown FIG. 10, a single metal gate electrode 36 is formed on the threshold voltage adjusted gate stacks 30, 32, and 34 followed by the deposition of another Si-containing material 38 (see FIG. 11). The single metal gate electrode 36 may include an elemental metal, an alloy including an elemental metal or metal nitride from Group VIB, VIIB and VII of the Periodic Table of Elements. The another Si-containing material 38 may comprise a conformal Si-containing material layer as shown in FIG. 9A or a blanket and planarized Si-containing material as shown in FIG. 9B. In FIG. 10, the later is shown. In this embodiment of the invention, a structure is provided that includes one device region including a first threshold voltage adjusted gate stack atop a semiconductor substrate, said first threshold voltage adjusted gate stack including a gate dielectric located on a surface of the semiconductor substrate, wherein a first threshold voltage adjusting species is present within the gate dielectric, a threshold voltage adjusting layer located beneath the gate dielectric, between the gate dielectric and the semiconductor substrate, and/or within the substrate; and another device region including a second threshold voltage adjusted gate stack atop a semiconductor substrate, said second threshold voltage adjusted gate stack including a gate dielectric located on a surface of the semiconductor substrate, wherein a second threshold voltage adjusting species is present within the gate dielectric, a threshold voltage adjusting layer located beneath the gate dielectric, between the gate dielectric and the semiconductor substrate, and/or within the substrate.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a semiconductor structure comprising:

providing a semiconductor substrate including at least a first device region, a second device region and a third device region;

forming a first threshold voltage adjusting layer within said first device region, said first threshold voltage adjusting layer being absent from said second and third device regions and the first threshold voltage adjusting layer including one of an nFET threshold voltage adjusting material or a pFET threshold voltage adjusting material;

forming a gate dielectric within said first device region, said second device region and said third device region;

forming a second threshold device layer within either said second or third device regions, yet absent from said first device region, said second threshold voltage adjusting layer is the other of said nFET threshold voltage adjusting material or the pFET threshold voltage adjusting material; and forming a gate conductor within said first, second and third device regions.

2. The method of claim 1 wherein said semiconductor substrate is a bulk semiconductor substrate or a semiconductor-on-insulator substrate including a top semiconductor layer located on a buried insulating layer, said top semiconductor layer is patterned to form at least one semiconductor fins within each of the device regions.

3. The method of claim 1 wherein said first threshold voltage adjusting layer is an nFET threshold voltage adjusting material.

4. The method of claim 3 wherein said nFET threshold voltage adjusting material is a Group IIIB rare earth metal or a rare earth metal-containing material that comprises an oxide or nitride of at least one element from Group IIIB of the Periodic Table of Elements.

5. The method of claim 4 wherein said Group IIIB element is one of La, Ce, Y, Sm, Er and Tb.

6. The method of claim 3 wherein said nFET threshold voltage adjusting material is an alkaline earth metal containing material that comprises a compound of the formula $MA_x$ wherein M is an alkaline earth metal, A is one of O, S and a halide, and x is 0, 1 or 2.

7. The method of claim 1 wherein said pFET threshold voltage adjusting material includes Al, $Al_2O_3$, Ge, $GeO_2$, non-conductive compounds of Ti, or non-conductive compounds of Ta.

8. The method of claim 1 wherein said gate dielectric is a dielectric material having a dielectric constant of greater than 4.0.

9. The method of claim 1 wherein said gate conductor comprises polySi, SiGe, an elemental metal, an alloy of an elemental metal or a silicide of an elemental metal.

10. The method of claim 1 further comprising forming a Si-containing material within each of the device regions.

11. The method of claim 10 further comprising the steps of:
- annealing to cause diffusion of threshold voltage adjusting species from the first and second threshold adjusting layers into, or beneath the gate dielectric;
- removing the Si-containing material, the gate conductor, and the first and second threshold voltage adjusting layers;
- forming a single metal gate electrode; and
- forming another Si-containing material atop the single metal gate electrode.

12. The method of claim 1 further comprising forming another threshold voltage adjusting layer in at least one of said second device region or said third device region, but not said first device region, prior to forming the gate dielectric.

13. A method of fabricating a semiconductor structure comprising:
- providing a semiconductor substrate including at least a first device region, a second device region and a third device region, each device region including at least one semiconductor fin;
- forming a first threshold voltage adjusting layer within said first device region, said first threshold voltage adjusting layer being absent from said second and third device regions and the first threshold voltage adjusting layer including one of an nFET threshold voltage adjusting material or a pFET threshold voltage adjusting material;
- forming a gate dielectric within said first device region, said second device region and said third device region;
- forming a second threshold voltage adjusting layer within either said second or third device regions, yet absent from said first device region, said second threshold voltage adjusting layer is the other of said nFET threshold voltage adjusting material or the pFET threshold voltage adjusting material;
- forming a gate conductor within said first, second and third device regions; and
- forming a Si-containing material atop said gate conductor in each of the device regions.

14. The method of claim 13 further comprising the steps of:
- annealing to cause diffusion of threshold voltage adjusting species from the first and second threshold adjusting layers into, or beneath the gate dielectric;
- removing the Si-containing material, the gate conductor, and the first and second threshold voltage adjusting layers;
- forming a single metal gate electrode; and
- forming another Si-containing material atop the single metal gate electrode.

* * * * *